United States Patent
Iwasaki et al.

(10) Patent No.: US 6,187,132 B1
(45) Date of Patent: *Feb. 13, 2001

(54) SUBSTRATE TREATMENT DEVICE AND SUBSTRATE TRANSPORTING METHOD

(75) Inventors: Tatsuya Iwasaki; Kiyohisa Tateyama, both of Kumamoto (JP)

(73) Assignee: Tokyo Electron Ltd. (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/041,450

(22) Filed: Mar. 12, 1998

(30) Foreign Application Priority Data

Mar. 13, 1997 (JP) .................................... 9-076686

(51) Int. Cl.[7] .............................. C23F 1/02; B08B 7/04; C23C 16/00
(52) U.S. Cl. .............................. 156/345; 134/18; 134/21; 134/31; 118/729; 438/905
(58) Field of Search .............................. 118/729; 134/18, 134/21, 31; 438/905; 156/345

(56) References Cited

U.S. PATENT DOCUMENTS 5,695,817 * 12/1997 Tateyama et al. ................... 427/240

FOREIGN PATENT DOCUMENTS 07-066171 * 3/1995 (JP) .
08-241880 * 9/1996 (JP) .

* cited by examiner

Primary Examiner—Mark L. Bell
Assistant Examiner—Patricia L. Hailey
(74) Attorney, Agent, or Firm—Rader, Fishman & Grauer

(57) ABSTRACT

A substrate treatment device comprises a transporting arm for transporting a substrate within the treatment device, a supporting member, which is disposed on the transporting arm, for supporting the substrate, and a cleaning mechanism, which is installed in the substrate treatment device, for cleaning the supporting member. Since the substrate treatment device is equipped with the cleaning mechanism for cleaning the supporting member, the supporting member can be cleaned as required. Therefore, since the substrate always can be held on a clean supporting member, the particles are prevented from depositing on the rear surface of the substrate.

20 Claims, 5 Drawing Sheets

SUBSTRATE TREATMENT DEVICE AND SUBSTRATE TRANSPORTING METHOD

BACKGROUND OF THE INVENTION

The present invention relates to a substrate treatment device for treating a substrate such as a semiconductor wafer or a LCD substrate, and a transporting method used for the device.

In production of a semiconductor device and a liquid crystal display(LCD), a circuit pattern is formed with a so-called photolithography technology in which a semiconductor wafer or a LCD substrate which serve as a substrate is coated with photo-resist solution to form a resist film, the resist film is exposed according to a circuit pattern, and the resulting film is developed.

In such coating/developing treatment, when a series of treatments are executed on a substrate, transportation of a substrate is required between various treatment units or between a treatment unit and a cassette. In the transporting operation, a transporting arm is normally used. This transporting arm is mainly constituted of an arm body capable of rotation and horizontal and vertical movement when the substrate is transported or carried out to/from a treatment unit or a cassette, and a pad which is a supporting member for supporting a substrate disposed on the arm body.

This transporting arm moves frequently between various treatment units or between a treatment unit and a cassette, and, during the movement, particles such as dust or dirt tend to deposit thereon. In particular, when these particles are adhered on the pad, since the particles adhere on the rear surface of the substrate to be transported thereafter, an unfavorable result will be induced.

SUMMARY OF THE INVENTION

An object of the present invention is to provide a substrate treatment device capable of treating the substrate without depositing particles on a rear surface of a substrate and a substrate transporting method which can be used in such device.

For this, a substrate treatment device of the present invention comprises a transporting arm for transporting a substrate within the treatment device, a supporting member, which is disposed on the transporting arm, for supporting the substrate, and a cleaning mechanism, which is installed in the substrate treatment device, for cleaning the supporting member. Since the substrate treatment device is equipped with the cleaning mechanism for cleaning the supporting member, the supporting member can be cleaned as occasion demands. Therefore, since the substrate always can be kept in a clean state, the particles are prevented from adhering on the rear surface of the substrate.

A substrate transporting method of the present invention comprises a step for cleaning the supporting member before or after the supporting member contacts with the substrate in a transporting process of the substrate with a transporting arm which possesses a supporting member for supporting the substrate during treatment of the substrate. Therefore, during transportation of the substrate, the substrate can be kept in a state in which there is no particle on the supporting member. In consequence, the rear surface of the substrate can be prevented from deposition of the particles during treatment of the substrate.

DETAILED DESCRIPTION OF THE INVENTION

In the following, with reference to the drawings, embodiments of the present invention will be described.

Figure 1:
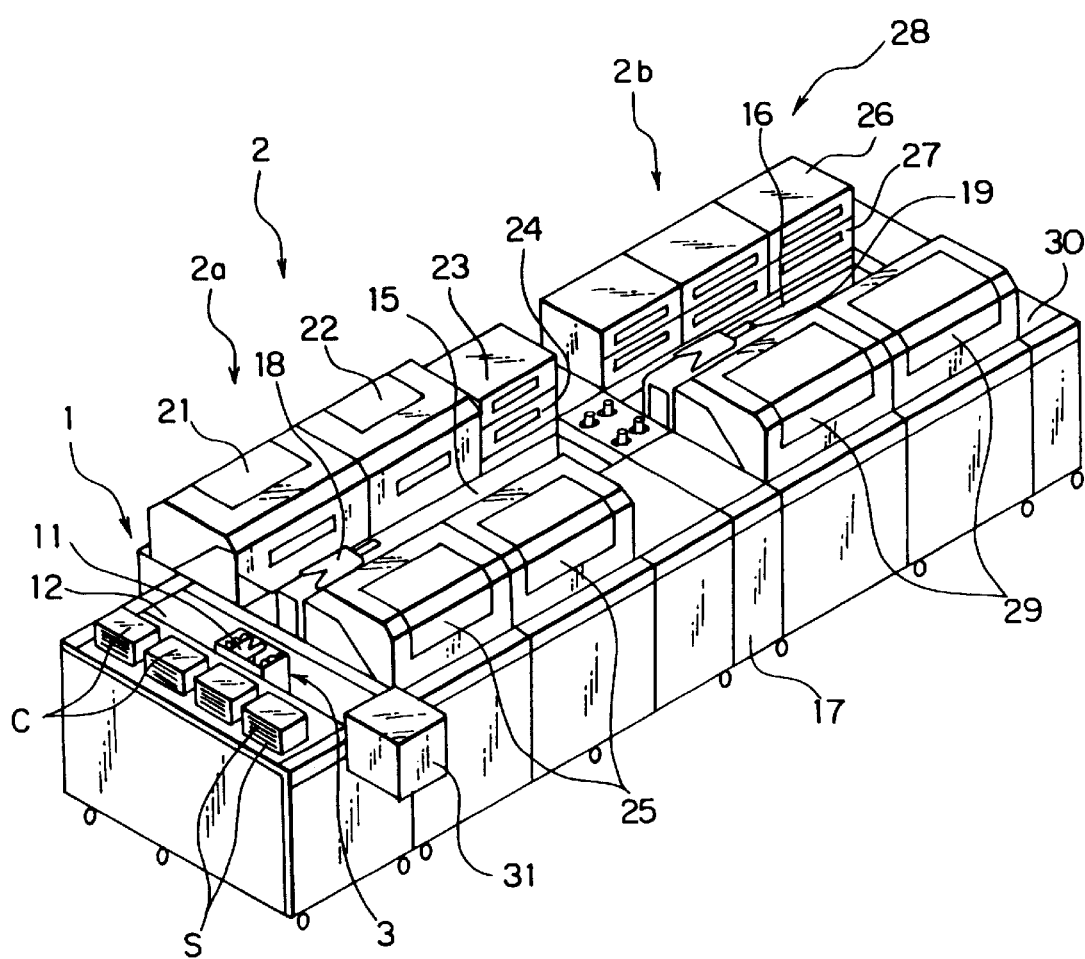
FIG. 1 is a perspective view showing a resist coating/developing system in which a substrate treatment device of the present invention is incorporated.

FIG. 1 is a perspective view showing a resist coating/developing system of a LCD substrate in which the present invention is applied. This coating/developing system comprises a cassette station 1 in which a cassette C accommodating a plurality of substrates S is disposed, a treatment portion 2 equipped with a plurality of treatment units for executing a series of treatments including resist coating on a substrate S and development thereof, and a transporting mechanism 3 for transporting a semiconductor wafer between a cassette C on a cassette station 1 and a treatment portion 2. In the cassette station 1, transporting the cassette C into the system and carrying the cassette C from the system are executed. The transporting mechanism 3 is equipped with a transporting arm 11 capable of moving on a transporting path 12 disposed along an arranging direction of the cassette, and, by this transporting arm 11, the substrate S is transported between the cassette C and the treatment portion 2.

The treatment portion 2 is divided into two portions, a former portion 2a and a latter portion 2b. Along each central area they have paths 15, 16, and on both sides of these paths each treatment unit is disposed. And, between the former portion 2a and the latter portion 2b, an interconnection portion 17 is disposed.

The former portion 2a is equipped with a main arm 18 capable of moving along the path 15, on one side of which a brush cleaning unit 21, a water cleaning unit 22, an adhesion treatment unit 23 and a cooling unit 24 are disposed, and, on the opposite side thereof, two resist coating units 25 are disposed. Besides, the latter portion 2b is equipped with a main arm 19 capable of moving along the path 16, on one side of which a thermal unit group 28 consisting of a plurality of heat treatment units 26 and a cooling unit 27 is disposed, and, on the opposite side thereof, two development units 29 are disposed. In the thermal unit group 28, three sets of two-storied units are lined along the path 19, wherein an upper floor is the heat treatment unit 26 and the lower floor is the cooling unit 27. In the heat treatment unit 26, such treatment as pre-bake for stabilizing the resist, post-exposure bake after exposure, and post-bake treatment after development are executed. Behind the rear edge portion of the latter portion 2b, an interface portion 30 for delivering the substrate S between an exposure device (not shown in the figure) is disposed.

The main arm 18 delivers the substrate S between an arm 11 of the transporting mechanism 3, to carry in and out the substrate S to and from each treatment unit of the former portion 2a, and to deliver the substrate S between the interconnection portion 17. The main arm 19 delivers the substrate S between an interconnection portion 17, to transport in and out the substrate S to and from each treatment unit of the latter portion 2b, and to deliver the substrate S between the interface portion 30. As in this system, by collecting each treatment unit to integrate, space saving and improvement of effectiveness of the treatment can be attained.

In the coating/development treatment system constituted in the above described manner, the substrate S in a cassette C is transferred to the treatment portion 2, and, is first treated for cleaning with the brush cleaning unit 21 and water cleaning unit 22, and thereafter, to heighten fixing ability of resist, is treated to be hydrophobic at the adhesion treatment unit 23, and then, after being cooled by the cooling unit 24, the resist is coated at the resist coating unit 25. Thereafter, the substrate S is treated for pre-bake step at one heat treatment unit of the heat treatment unit 26, then, after being cooled with the cooling unit 27, is transferred to an exposure device through the interface portion 30. A predetermined pattern is exposed on the substrate with this exposure device.

Thereafter, the substrate S is again carried in the system through the interface portion 30, and, at one of the heat treatment units 26, treatment for post-exposure bake is executed. Thereafter, the substrate S cooled by the cooling unit 27, is developed at the development treatment unit 29 and a predetermined circuit pattern is formed. The developed substrate S is accommodated in a predetermined cassette on the cassette station 1 with the main arms 19, 18, and the transporting mechanism 3.

Figure 2A:
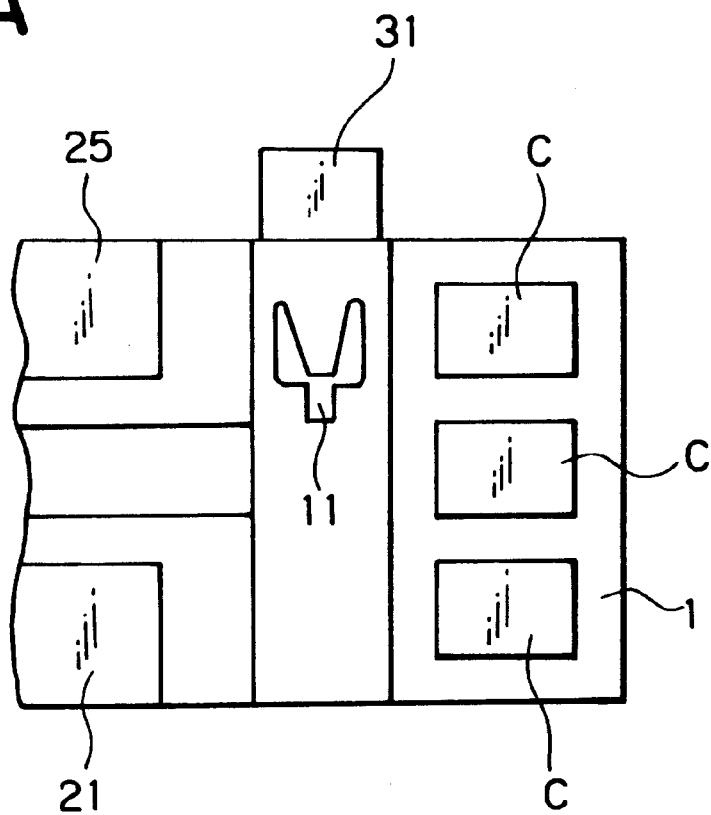
FIG. 2A and FIG. 2B are simplified plan and side view, respectively, for explaining a position of a cleaning mechanism of a substrate treatment device of the present invention.
Figure 2B:
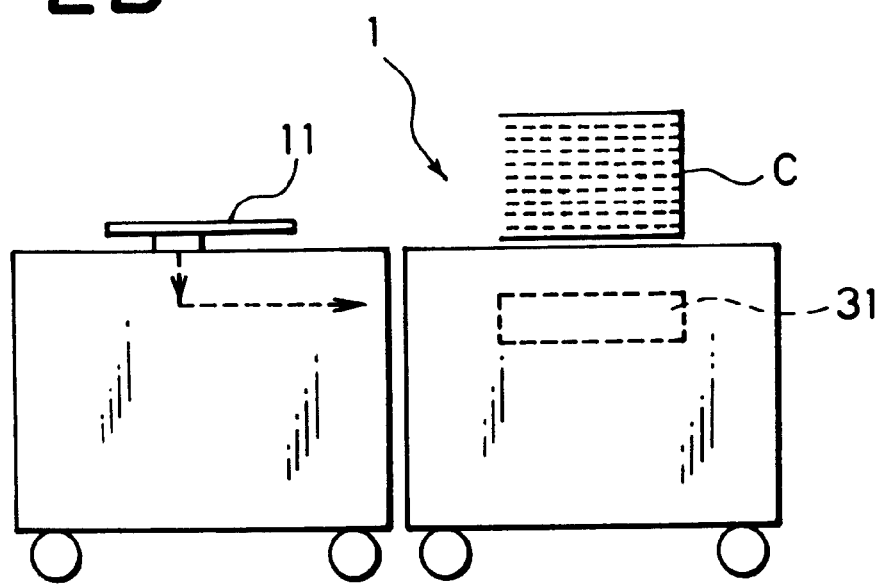

FIG. 2A and FIG. 2B are diagrams for explaining a position of cleaning mechanism of the substrate treatment device of the present invention. The cleaning mechanism 31 in the substrate treatment device of the present invention, as shown in FIG. 2A for example, can be disposed on a side portion of the cassette station 1, or, as shown in FIG. 2B for example, can be preferably disposed in a built-in manner in the lower portion of the cassette C in the cassette station 1.

By disposing the cleaning mechanism 31 in such positions, trouble due to cleaning of the transporting arm 11 can be prevented from occurring during a series of treatments of the substrate. That is, treatment of the substrate can be prevented from being delayed due to cleaning of the transporting arm. Thereby, without making the tact time longer, the transporting arm 11 can be cleaned. Therefore, the position, where the cleaning mechanism 31 is disposed, is not restricted in particular positions if they do not induce any trouble to substrate transportation.

As a driving means for moving the transporting arm 11 to the cleaning mechanism 31, a driving means for driving the transporting arm 11 can be employed as it is by controlling transporting distance of the arm. That is, when the cleaning mechanism 31 is disposed in a position shown in FIG. 2A, in the driving means of the transporting arm 11, its horizontal traveling distance is controlled in such a manner that the transporting arm can be moved into the cleaning mechanism 31 of the side portion of the cassette station 1. In this case, vertical traveling distance is not particularly required to be changed. By controlling the driving means of the transporting arm in this manner and, by moving the transporting arm 11 as shown by an arrow in FIG. 2B, the transporting arm 11 is disposed in the cleaning mechanism 31, and, there, the transporting arm, in particular, the supporting member is cleaned.

Besides, when the cleaning mechanism 31 is disposed at a position shown in FIG. 2B, the driving means of the transporting arm 11 is controlled in its vertical travelling distance so as to make it go down up to a position of the lower portion of the cassette station 1. In this case, the horizontal travelling distance is not required particularly to be changed if the cleaning mechanism 31 is disposed at a position in a cassette station 1 corresponding to a position of the cassette C. By thus controlling the driving means of the transporting arm to move the transporting arm 11 as shown by an arrow in FIG. 2B, the transporting arm 11 is disposed in the cleaning mechanism 31 where the transporting arm 11, in particular, the supporting member is cleaned. In addition, the cleaning mechanism of the main arms 18,19 can be disposed at any position if the disposed position is within the substrate treatment device and within the travelling range of the main arms 18, 19. In this case, as to cleaning and movement of the main arms 18,19, the situation is identical as the case of the transporting arm 11.

Figure 3:
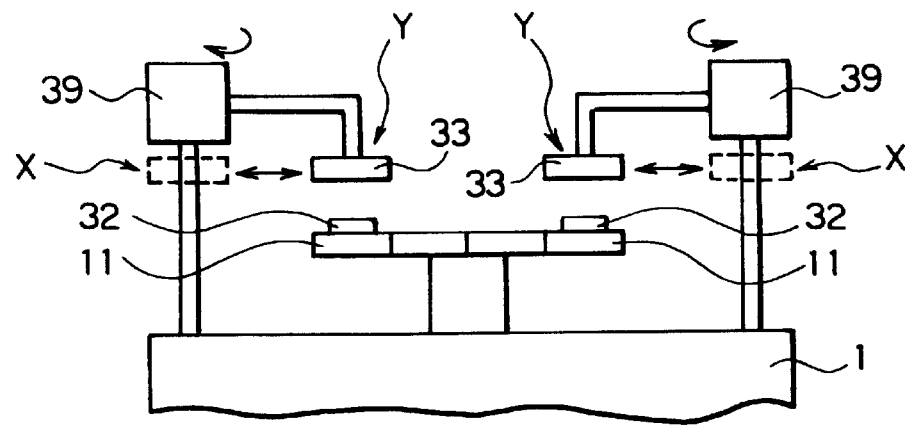
FIG. 3 is a simplified front view of a cleaning mechanism of a substrate treatment device of the present invention.

The cleaning mechanism 31, as shown in FIG. 3, can be constituted in such a manner that a cleaning member 33 can be moved by a driving mechanism 39. That is, when the substrate is transported, the cleaning member 33 stays at a position where the cleaning member 33 does not cause any trouble for transporting the substrate(for example, X position), and, during cleaning operation, the cleaning member 33 is moved in the vicinity of the supporting member 32 of the transporting arm 11 (Y position in FIG. 3) by the driving means 39 to clean the supporting member 32 of the transporting arm 11. Concerning timing and operation for moving the cleaning member 33, the driving means 39 is controlled by a controlling means (not shown).

Figure 4:
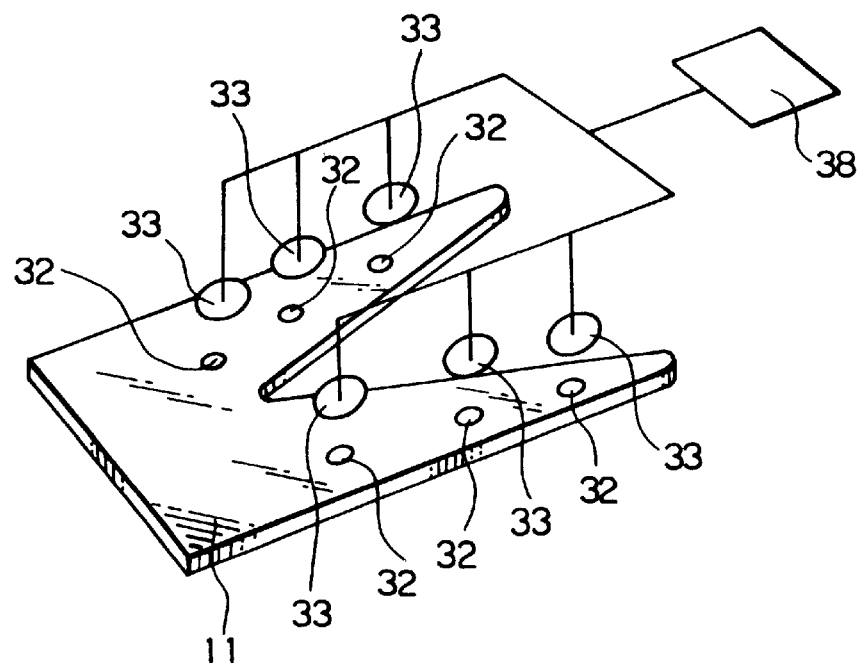
FIG. 4 is a perspective view showing a state for cleaning a transporting arm in a cleaning mechanism of the present invention.

FIG. 4 is a diagram for explaining a state where the transporting arm 11 is cleaned in the cleaning mechanism. When the transporting arm 11 is disposed in a predetermined position in the cleaning mechanism 31, that is, as shown in FIG. 4, when each supporting member 32 is disposed beneath a plurality of cleaning members 33 disposed at the positions corresponding to the supporting member 32 on the transporting arm 11, the cleaning member 33 is lowered by a vertically travelling means (not shown) to clean the supporting member 32 and to eliminate the particles adhered to the supporting member 32.

During cleaning operation, the cleaning member 33 can be solidly fixed to the cleaning mechanism 31 without moving up or down, or, while fixing the cleaning member 33, the transporting arm 11 can be constituted to be raised. Namely, relative up and down movement will be enough. Further, control of a plurality of cleaning members 33, as shown in FIG. 4, can be executed integrally or separately with the control means 38. By executing the separate control of a plurality of cleaning members 33, the supporting member 32 on the transporting arm 11 can be selectively and strongly cleaned at the portion where the particles are prone to adhere, thus cleaning degree can be varied as required.

Figure 5:
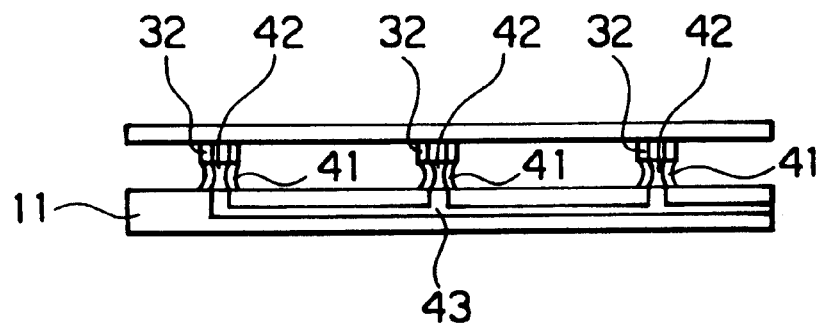
FIG. 5 is a simplified side view showing a supporting member on a transporting arm in a substrate treatment device of the present invention.

The supporting member 32 possesses a structure as shown, for example, in FIG. 5. That is, between the transporting arm 11 and the supporting member 32, a buffering member 41 consisting of such as resin or rubber is interposed. On both the buffering member 41 and the supporting member 32, respectively interconnecting through hole 42 is disposed, and the through hole 42 is interconnected with a path 43 disposed on the transporting arm 11. The path 43 is connected to a vacuum means (not shown), and, by making a vacuum state through the vacuum means, the substrate supported on the supporting member 32 through the path 43 and the through hole 42 is vacuum absorbed. By interposing the buffering member 41 between the supporting member 32 and the transporting arm 11, even when the substrate has warp or the like, since the buffering member 41 deforms when the substrate pressurizes the supporting member 32, thereby the supporting member 32 firmly supports the substrate while conforming the warp or the like of the substrate. Without restricting to such a vacuum pad, a structure in which the supporting member 32 is directly disposed on the transporting arm 11 can be used. In addition, these supporting member 32 can be, without restricting to the transporting arm 11, also used in the main arms 18,19.

Figure 6A:
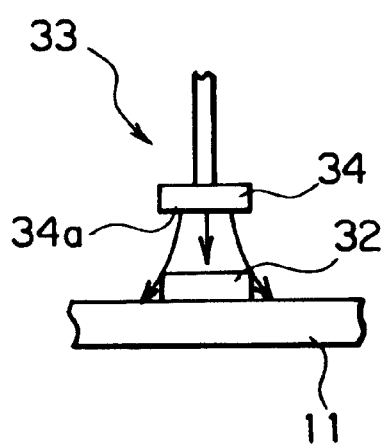
FIG. 6A and FIG. 6B are front views showing respectively main portions of the cleaning mechanism of the substrate treatment device of the present invention.
Figure 6B:
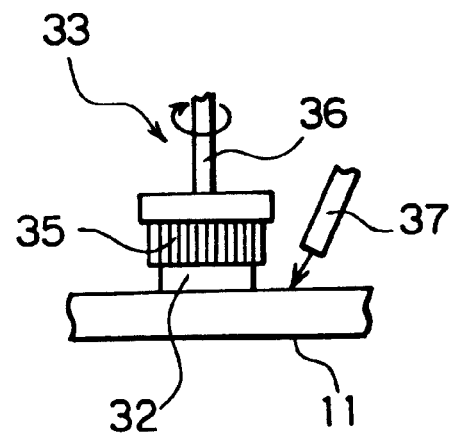

As a cleaning member 33 for cleaning the supporting member 32, a gas carrier method for cleaning shown in FIG. 6A or a scrubbing method shown in FIG. 6B can be used. In specific, in the gas carrier method, for example, as shown in FIG. 6A, gas such as $N_2$ gas, air or the like is spouted on the supporting member 32 from a nozzle 34. The size (area) of the purging portion 34a of the nozzle 34 is preferably a size which allows for the gas to be evenly spouted on the supporting member 32.

In the scrubbing method, as shown, for example, in FIG. 6B, while rotating a shaft 36 by a rotation driving means (not shown), a cleaning member 35 is made to contact the supporting member 32. In this case, as a cleaning liquid, alcohol, water and the like can be supplied to a portion to be washed through a cleaning liquid supply pipe 37. By executing cleaning in such a wet state, the supporting member 32 can be prevented from receiving damage. Further, as a cleaning member 35, a brush, a sponge and the like can be used. The cleaning liquid supply pipe 37 can be disposed separately from the cleaning member 35 as shown in FIG. 6B or can be inserted in the shaft 36 to be integrated.

Next, a method for transporting the substrate with the substrate treatment device possessing the above described structure will be explained.

A transporting arm 11 brings out a substrate S accommodated in a cassette C from the cassette C and delivers it to a main arm 18. The transporting arm 11 which delivered the substrate S, as shown in FIG. 2A, travels to a cleaning mechanism 31 disposed at the side portion of a cassette station 1. Then, the transporting arm 11 is inserted into the cleaning mechanism 31 in such a manner that the supporting member 32 is placed below the cleaning member 33. In this state, the supporting member 32 is cleaned by the gas carrier method or the scrubbing method. After the cleaning operation is finished, the supporting member 32 is dried as occasion demands. Thereafter, the transporting arm 11 is moved to a position where the substrate S should be delivered from the cleaning mechanism 31.

The main arm 18, after transportation of the substrate between each unit or delivery of the substrate from the transporting arm 11, as shown in FIG. 2B, descends to a lower level than its normal travelling height, travels towards the cassette station 1, and is inserted in the cleaning mechanism 31 disposed in the lower portion of the cassette station 1. In this state, the supporting member 32 is cleaned with the gas carrier method or the scrubbing method. After cleaning is finished, the supporting member 32 is dried as required. Thereafter, the main arm 18 is moved from the position of the cleaning mechanism 31 to that of the transporting path 12 and is raised to the position of the normal travelling height.

By cleaning the transporting arm 11 or the main arm 18 in such a manner, the supporting member 32 supporting the substrate S is prevented from adhering to the particles and the rear surface of the substrate S is prevented from being contaminated. In addition, cleaning of the transporting arm 11 or the main arm 18 can be executed each time when the supporting member 32 contacts the substrate, or, can be executed after the number of a predetermined total transportation (delivery) is reached. Or the supporting member 32 can be cleaned immediately before it contacts with the substrate.

Figure 7:
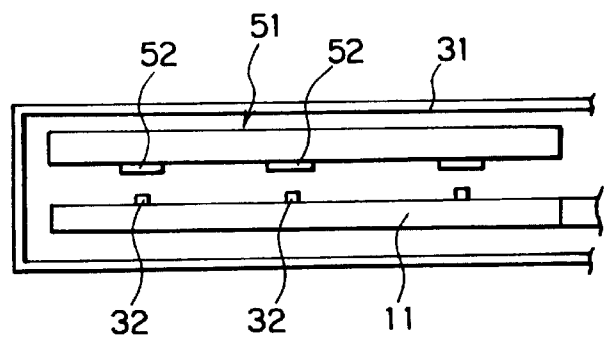
FIG. 7 is a side view of a main portion of another example of the cleaning mechanism of the substrate treatment device of the present invention.
Figure 8:
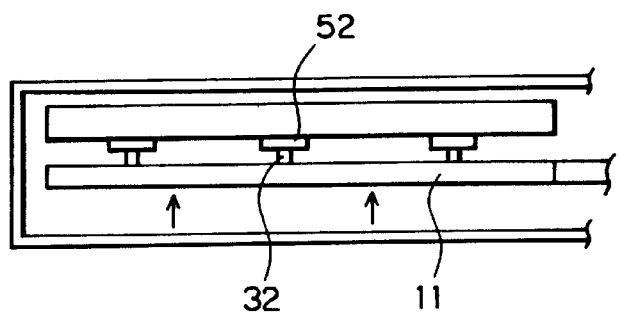
FIG. 8 is a side view of a main portion showing movement of the cleaning mechanism of FIG. 7.
Figure 9:
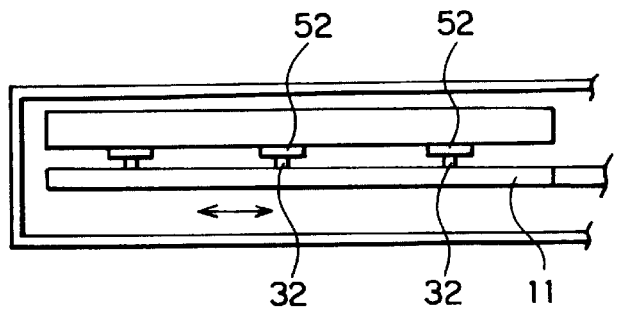
FIG. 9 is a side view of a main portion showing movement of the cleaning mechanism of FIG. 7.

The present invention can be modified in various ways without restricting to the above described embodiments. As shown, for example, in FIG. 7, another cleaning member 51 is disposed in the cleaning mechanism 31. On the lower surface of the cleaning member 51, a cleaning member 52 is disposed corresponding to the position of the supporting member 32. The cleaning member 52 is a nonwoven fabric or a fabric wet with, for example, IPA (iso-propyl alcohol) and is soft. As shown in FIG. 8, when the transporting arm 11 is inserted into the cleaning mechanism 31 to reach a predetermined position, the transporting arm 11 is raised to make contact between the supporting member 32 and the cleaning member 52. Next, as shown in FIG. 9, the transporting arm 11 is slid along the horizontal direction, or swayed. Thereby, the surface of the supporting member 32 is cleaned.

Figure 10:
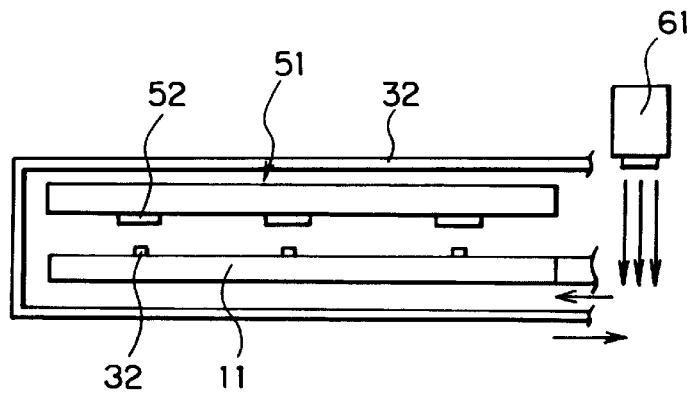
FIG. 10 is a side view of a main portion of another example of the cleaning mechanism of the substrate treatment device of the present invention.

Still further, as shown in FIG. 10, at the inlet/outlet portion of the cleaning mechanism 31, an air curtain mechanism 61, forming a down-flow of clean air or nitrogen gas, can be disposed. Thereby, in a step before and after being inserted in the cleaning mechanism 31, the particles adhered on the supporting member 32 of the transporting arm 11 can be blown away. Further, after the cleaning, the supporting member can be dried quickly.

Although the substrate cooling device of the present invention is applied in the resist coating/development unit in the above embodiments, the device can be applied in treatment other than this. Further, although, in the above described embodiments, an LCD substrate is used as a substrate, a semiconductor wafer and the like other than this can be applicable in the case of the treatment of the substrate.

As described above, in a substrate treatment device of the present invention, since a cleaning mechanism for cleaning a transporting arm, in particular, a supporting member on the transporting arm, is installed in the substrate treatment device, the supporting member can be cleaned as required, the substrate can be supported always in a clean state, and, the particles are prevented from adhering on the rear surface of the substrate.

In a substrate transporting method of the present invention, since a supporting member is cleaned after or before the supporting member on a transporting arm contacts a substrate, during transportation of the substrate, the substrate can be supported in a state that there is no particle on the supporting member. Therefore, the particles can be prevented from adhering on the rear surface of the substrate during treatment.

In the present invention, since a cleaning mechanism is equipped with a gas supplying method, during cleaning operation of a supporting member, by removing the particles on the supporting member by purging gas onto the supporting member, the particles can be removed without making contact with the supporting member, and, without damaging the supporting member during cleaning operation, occurrence of the particle due to cleaning can be prevented.

In the present invention, a cleaning mechanism is equipped with a cleaning liquid supplying means for supplying a cleaning liquid to a supporting member and a cleaning member for cleaning the supporting member by making contact with the supporting member, wherein, the particles adhered to the supporting member can be more firmly removed by removing the particles on the supporting member by contacting the cleaning member with the supporting member while supplying the cleaning liquid to the supporting member.

In the present invention, by transferring a cleaning mechanism in the vicinity of a transporting arm, since there is no particular movement of the transporting arm required due to cleaning of the transporting arm, lengthening of the time during substrate transportation can be avoided.

What is claimed is:

1. A substrate treatment device for treating a substrate, comprising:

a transporting arm for transporting a substrate in the substrate treatment device;

a supporting member disposed on the transporting arm, for supporting the substrate; and a cleaning mechanism, installed in the substrate treatment device, for cleaning the supporting member.

2. The substrate treatment device as set forth in claim 1, wherein the cleaning mechanism is underneath a cassette accommodating the substrate.

3. The substrate treatment device as set forth in claim 1, further comprising:

a driving means for transferring the transporting arm to the cleaning mechanism.

4. The substrate treatment device as set forth in claim 1, wherein the cleaning mechanism is movable in the vicinity of the transporting arm.

5. The substrate treatment device as set forth in claim 1, wherein the cleaning mechanism comprises a gas supplying means for supplying gas to the supporting arm.

6. The substrate treatment device as set forth in claim 1, wherein the cleaning mechanism comprises a cleaning liquid supplying means for supplying the cleaning liquid to the supporting member and a means for aspirating the cleaning liquid onto the supporting member.

7. The substrate treatment device as set forth in claim 1, wherein the cleaning mechanism comprises a cleaning liquid supplying means for supplying the cleaning liquid to the supporting member, and a cleaning member for cleaning the supporting member by contacting with the supporting member.

8. The substrate treatment device as set forth in claim 7; wherein the cleaning member is a brush.

9. The substrate treatment device as set forth in claim 7; wherein the cleaning member is a sponge soaked with the cleaning liquid.

10. The substrate treatment device as set forth in claim 7; wherein the cleaning member is a cloth like material soaked with the cleaning liquid.

11. The substrate treatment device as set forth in claim 7, wherein the cleaning mechanism comprises a mechanism for forming a down-flow of clean gas.

12. A substrate transporting method for transporting a substrate comprising steps of:

providing a transporting arm having a supporting member for supporting the substrate in a treatment of the substrate;

cleaning the supporting member before or after the supporting member contacts the substrate; and transporting the substrate by said supporting member.

13. The substrate transporting method as set forth in claim 12, further comprising the steps of:

transferring the transporting arm into a cleaning mechanism; and cleaning the supporting member within the cleaning mechanism.

14. The substrate transporting method as set forth in claim 12, further comprising the steps of:

transferring a cleaning mechanism a vicinity of the transporting arm; and cleaning the supporting member with the cleaning mechanism.

15. The substrate transporting method as set forth in claim 12;

wherein cleaning operation of the supporting member is executed by purging a gas to the supporting member.

16. The substrate transporting method as set forth in claim 12;

wherein cleaning operation of the supporting member is executed by, while supplying cleaning liquid to the supporting member, contacting a cleaning member with the supporting member.

17. The substrate transporting method as set forth in claim 12;

wherein cleaning operation of the supporting member is executed by contacting an object soaked with a cleaning liquid with the supporting member.

18. The substrate transporting method as set forth in claim 17, further comprising a step of:

purging clean gas to the supporting member before the supporting member is cleaned.

19. The substrate transporting method as set forth in claim 17, further comprising a step of:

purging clean gas to the supporting member after the supporting member is cleaned.

20. The substrate treatment device as set forth in claim 1, wherein the cleaning mechanism comprises a cleaning liquid supplying means for supplying cleaning liquid to the supporting member.

* * * * *